United States Patent [19]
Schulte et al.

[11] Patent Number: 4,878,012
[45] Date of Patent: Oct. 31, 1989

[54] CHARGE BALANCED FEEDBACK TRANSMITTER

[75] Inventors: John P. Schulte, Eden Prairie; Kelly M. Orth, Apple Valley; Roger L. Frick, Chanhassen; Brian L. Westfield, Eden Prairie; Randy K. Paschke, Chaska, all of Minn.

[73] Assignee: Rosemount Inc., Eden Prairie, Minn.

[21] Appl. No.: 205,268

[22] Filed: Jun. 10, 1988

[51] Int. Cl.$^4$ ............................................. G01R 27/26
[52] U.S. Cl. .............................. 324/60 CD; 324/60 R; 340/870.37
[58] Field of Search ............. 324/60 CD, 60 C, 60 R; 73/718, 724, 780; 340/870.37

[56] References Cited

U.S. PATENT DOCUMENTS

| | | | |
|---|---|---|---|
| 4,054,833 | 10/1977 | Briefer | 324/60 C |
| 4,187,459 | 2/1980 | Wolfendale | 324/60 C |
| 4,322,977 | 4/1982 | Sell et al. | 324/60 C X |
| 4,644,798 | 2/1987 | Tamura et al. | 73/718 X |
| 4,743,836 | 5/1988 | Grzybowski et al. | 324/60 CD |

FOREIGN PATENT DOCUMENTS 200119 11/1983 Japan ..................................... 73/724

Primary Examiner—Reinhard J. Eisenzopf
Assistant Examiner—Robert W. Mueller
Attorney, Agent, or Firm—Kinney & Lange

[57] ABSTRACT

A charge balanced feedback type transmitter generates charge packets representative of a sensed parameter. Improved performance is achieved by the addition of resistance connected between a charge packet generating reactance and an integrator to reduce the effects of noise caused by switching transients and by ground noise which is coupled to the charge packet generating circuitry by stray capacitance. The charge packets are integrated by the integrater, and the integrator output is supplied from a selective basis to the input of a comparator. The output of the comparator is used to control the application of charge packets to the integrator to achieve charge balance. The input of the comparator is selectively connected to the output of the integrator, to a first supply voltage, or to a second supply voltage to ensure a stable output of the comparator at a critical time when charge is being supplied to the integrator.

25 Claims, 5 Drawing Sheets

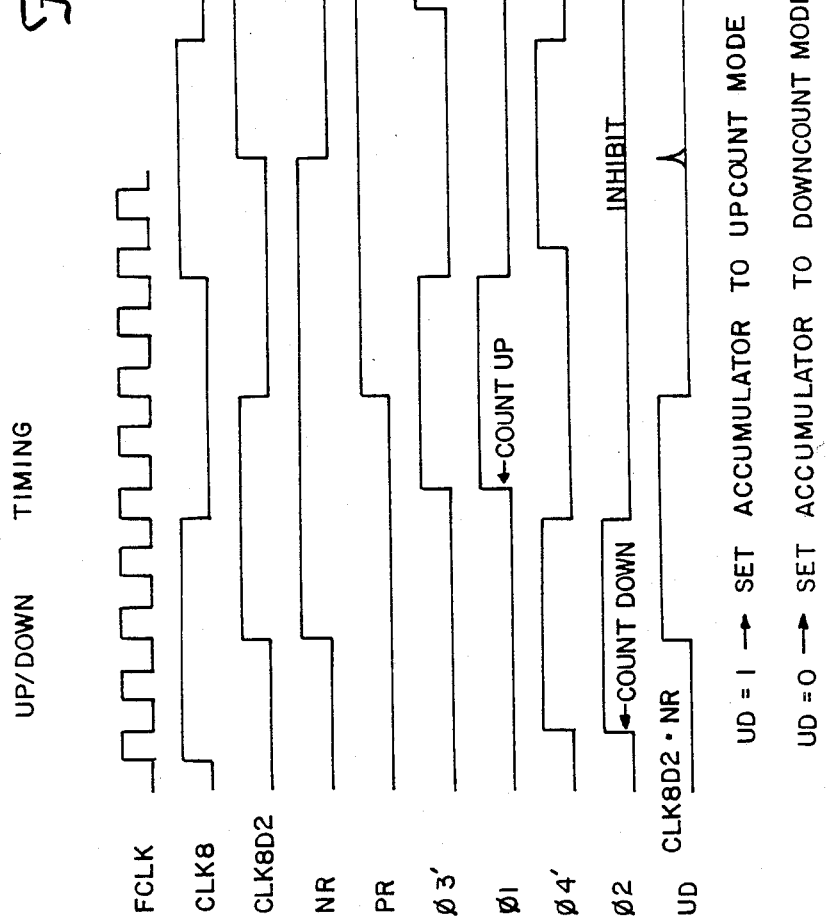

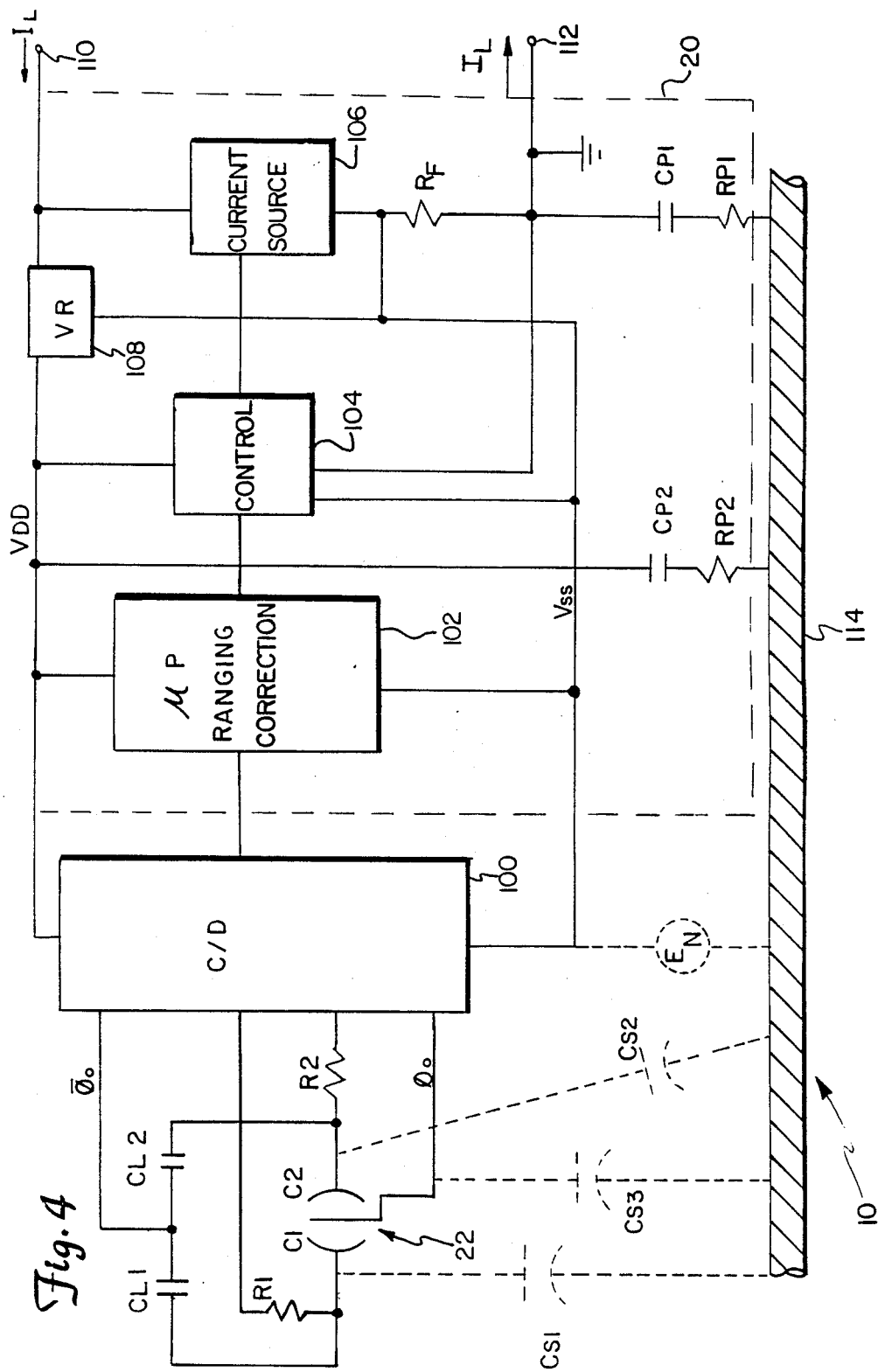

CHARGE BALANCED FEEDBACK TRANSMITTER

REFERENCE TO COPENDING APPLICATIONS

Reference is hereby made to the following copending applications:

Roger L. Frick and John P. Schulte, "MEASUREMENT CIRCUIT," Ser. No. 175,627, filed March 30, 1988, which is a file wrapper continuation of Ser. No. 855,178 filed April 23, 1986; and Roger L. Frick and John P. Schulte, "TRANSMITTER WITH VERNIER MEASUREMENT," Ser. No. 887,603 filed July 17, 1986.

Both of these applications are assigned to the same assignee as the present application. The subject matter of these applications is hereby incorporated by reference.

BACKGROUND OF THE INVENTION

The present invention relates to measurement circuits and, in particular, to improved circuits for measuring a parameter using circuitry which generates charge packets.

SUMMARY OF THE INVENTION

The two above-mentioned patent applications describe charge balanced measurement circuits which generate charge packets having a quantity of charge which is a function of a sensed parameter. The charge packets are provided to an integrator, which integrates the charge received. The output of integrator is provided to a comparator, which produces a comparator output which is used to control the number of charge packets so that the quantity of charge received by the integrator over time tends toward a charge balance. An output representative of the sensed parameter is provided as a function of the numbers of charge packets of each polarity which are formed.

The present invention relates to improvements to the charge balanced feedback type of circuit which reduce the effects of various sources of noise on the accuracy of the integrator output, and therefore on the accuracy of the output of the circuit.

In one embodiment of the present invention, resistance means is connected in a current path with the reactance means and the input of the integrator. The resistance means reduces the effects of noise coupled to the circuit through stray capacitance associated with the reactance means, and the effects of switching transients associated with the generation and transfer of the charge packets to the integrator input.

A further improvement to the circuit involves a multiplexed control of signals supplied to the input of the comparator. Switching means connected to the input of the comparator supplies, at selected times, the integrator output, a first voltage, or a second voltage to the input of the comparator. By providing the first and second voltages to the input of the comparator, the output of the comparator is stabilized in a known state and the threshold level of the comparator is selected prior to receiving the signal from the integrator output. The timing of the connection of the integrator output to the input of the comparator is controlled so that the integrator output has stabilized after receiving charge packets to integrate before the integrator output is supplied to the comparator input. This ensures a stable response by the comparator, which avoids an oscillation which could cause noise and disturb the accuracy of the output of the integrator.

BRIEF DESCRIPTION OF THE DRAWINGS

FIGS. 3A and 3B are a timing diagram for the feedback circuit of FIG. 2.

FIG. 4 is a circuit diagram of a two wire transmitter which incorporates the measurement circuit of the present invention.

DETAILED DESCRIPTION OF THE PREFERRED EMBODIMENTS

Figure 1:
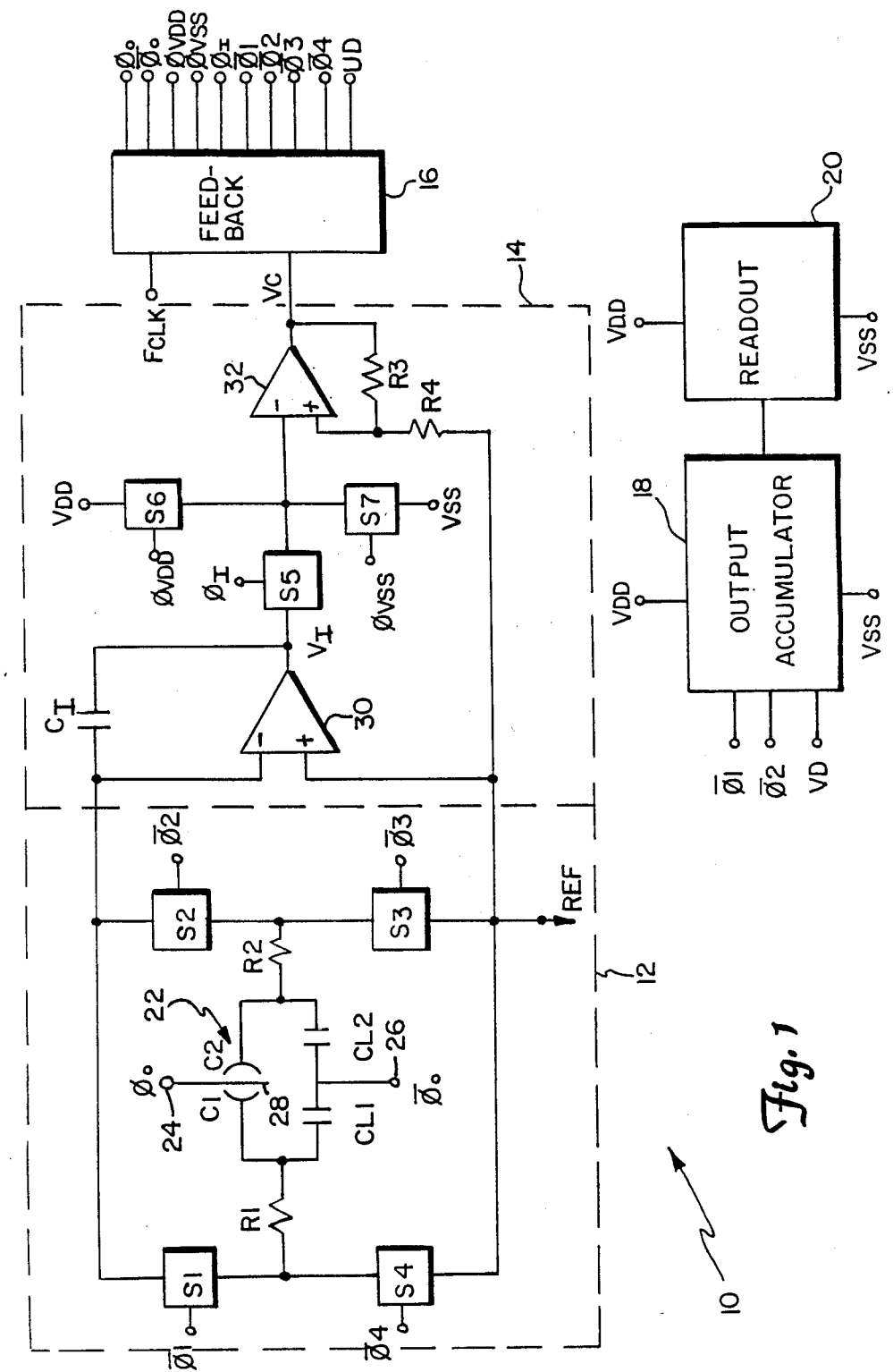
FIG. 1 is a diagram of a preferred embodiment of the measurement circuit of the present invention.

FIG. 1 shows a preferred embodiment of measurement circuit 10 of the present invention, which is of the charge balanced feedback type described in the two previously mentioned copending patent applications. Measurement circuit 10 includes charge packet generator circuit 12, integration and comparison circuit 14, feedback circuit 16, output circuit 18, and readout circuit 20.

Charge packet generator circuit 12 includes capacitive pressure sensor 22, which forms a pair of variable capacitances C1 and C2 which vary as a function of a sensed parameter (e.g. pressure). In a preferred embodiment, sensor 22 is the capacitive pressure sensor of the type shown in U.S. Pat. No. 4,370,890 by Roger L. Frick, in which the capacitive sensor is used with an electrically conductive, grounded, fluid isolator assembly which is part of a transmitter housing which encloses the sensor. Other sensors can be used as well. The description of the sensor found in U.S. Pat. No. 4,370,890 is incorporated by reference.

Charge packet generator circuit 12 also includes linearity correction capacitors CL1 and CL2, noise supression resistors R1 and R2, and switches S1, S2, S3, and S4. Capacitors CL1 and CL2 are connected in series with one another, and in parallel with capacitive sensor 22. Complementary drive $\phi_0$ and $\bar{\phi}_0$ signals are supplied to nodes 24 and 26, respectively. Node 24 is connected to center capacitor plate 28 of sensor 22, while node 26 is connected to the junction of capacitors CL1 and CL2.

Resistor R1 is connected at one end to capacitors C1 and CL1 and at its opposite end to switches S1 and S4. Similarly, resistor R2 isconnected at one end to capacitors C2 and CL2, and at its opposite end to switches S2 and S3. Drive signals $\bar{\phi}_1$, $\bar{\phi}_2$, $\bar{\phi}_3$, and $\bar{\phi}_4$ control the conductive states of switches S1, S2, S3, and S4, respectively.

Switches S1 and S2 are connected together to the inverting (−) input of integrator amplifier 30. Switches S3 and S4 are connected to reference potential $V_{REF}$ and to the non-inverting (+) input of integrator amplifier 30. In a preferred embodiment, reference voltage $V_{REF}$ is midway between supply voltages $V_{DD}$ and $V_{SS}$.

Integrating and comparing circuit 14 includes integrator-amplifier 30, integration capacitor $C_I$, switches S5, S6, S7, comparator 32, and resistors R3 and R4. Integrator amplifier 30 produces an integrator voltage $V_I$ at its output, which is representative of the integral of charge packets received at its inverting (−) input. Switches S5, S6, and S7, which are controlled by signals $\phi_I$, $\phi_{VDD}$ and $\phi_{VSS}$, respectively, form a multiplexer for supplying integrator voltage $V_I$, supply voltage $V_{DD}$, or supply voltage $V_{SS}$ to the inverting (−)

input of comparator 32. Resistor R3 is connected between the output of comparator 32 and its non-inverting (+) input, and resistor R4 is connected between the noninverting (+) input of comparator 32 and $V_{REF}$ to provide hysteresis. As a result, comparator 32 has two different threshold levels possible at its + input, depending upon the state of its output voltage $V_C$.

Output voltage $V_C$ from comparator 32 is supplied as an input to feedback circuit 16. Based upon the state of signal $V_C$, feedback circuit 16 derives ten signals from a basic clock signal $F_{CLK}$. These signals are $\phi_0$, $\bar{\phi}_0$, $\phi_{VDD}$, $\phi_{VSS}$, $\phi_I$, $\bar{\phi}_1$, $\bar{\phi}_2$, $\bar{\phi}_3$, $\bar{\phi}_4$, and UD.

Feedback circuit 16 controls the charge packets supplied to integrator 30 from charge packet generator circuit 12 to achieve a charge balance over time. One or more charge packets of a first polarity are supplied when the $\bar{\phi}_1$ signal closes switch S1 and thus connects capacitor C1 and CL1 through resistor R1 to the − input of integrator 30. Charge packets of opposite polarity are provided to integrator 30 when the $\bar{\phi}_2$ signal causes switch S2 to be closed.

Output circuit 18 receives the $\phi_1$ and $\phi_2$ signals, together with the UD signal from feedback circuit 16. The UD signal is indicative of whether the integrator is changing up or down. Output circuit 18 accumulates counts of packets of opposite polarity by counting either up or down, depending on the UD signal. Based upon the counts, output circuit 18 provides an output to readout circuit 20 which is representative of the sensed parameter, sensed by capacitor sensor 22 (as corrected by linearity capacitors CL1 and CL2).

Figure 2:
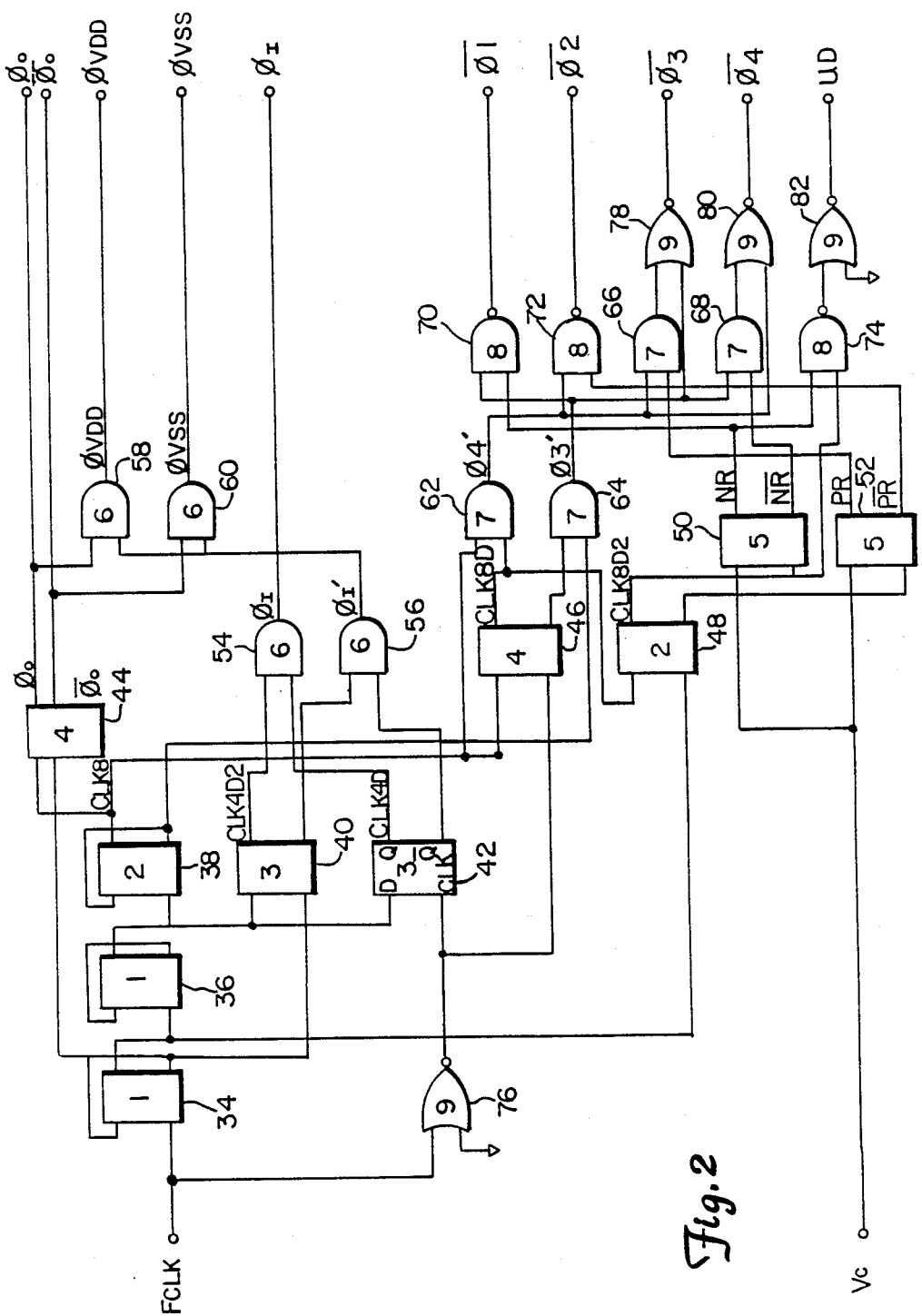
FIG. 2 is a circuit diagram showing the feedback circuit of the measurement circuit of FIG. 1.
Figure 3A:
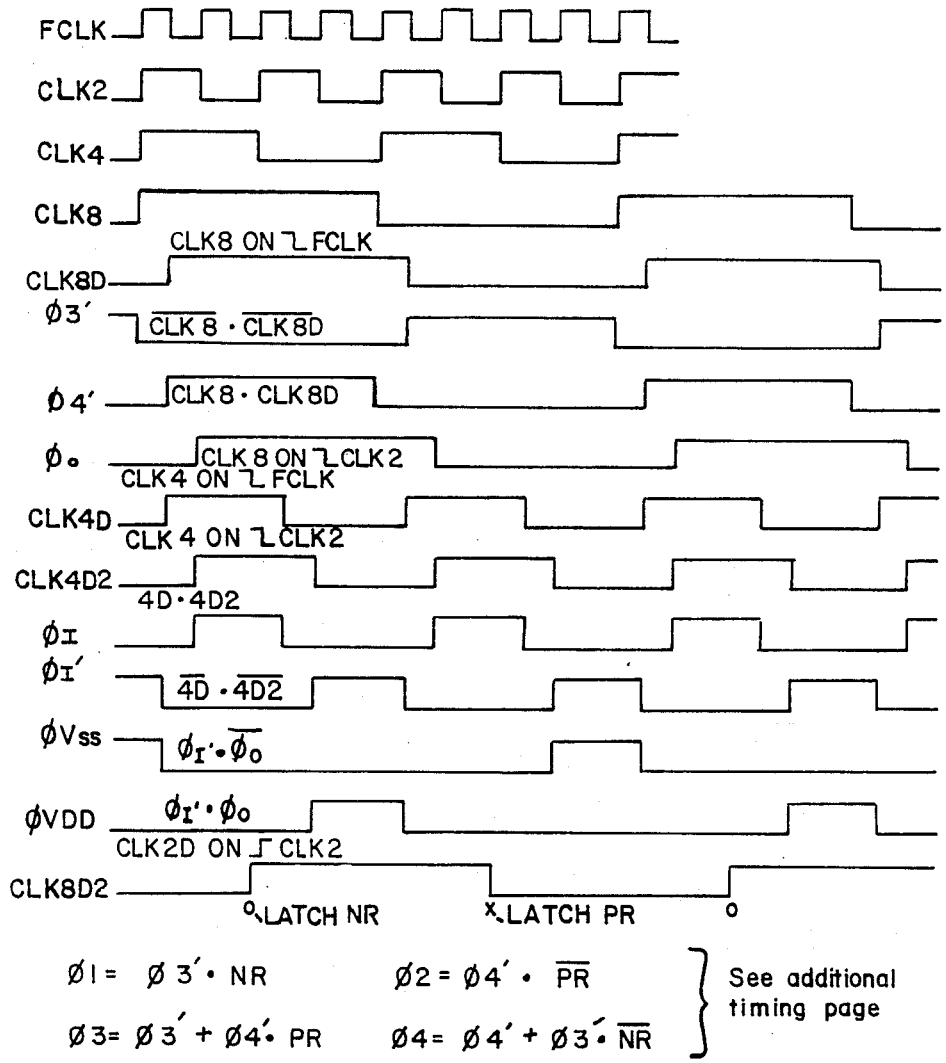

FIGS. 2, 3A and 3B illustrate one preferred embodiment of feedback circuit 16. FIG. 2 is a schematic diagram showing the logic circuitry of feedback circuit 16, while FIGS. 3A and 3B are timing diagrams showing signals generated by feedback circuitry 16 of FIG. 2.

As shown in FIG. 2, feedback circuitry 16 includes edge-triggered flipflops 34, 36, 38, 40, 42, 44, 46, 48, 50, and 52; AND gates 54, 56, 58, 60, 62, 64, 66, and 68; NAND gates 70, 72, and 74; and NOR gates 76, 78, 80 and 82. In FIG. 2, internal signals within feedback circuit 16, as well as the input and signals are labelled. These signals are shown in the timing diagrams found in FIGS. 3A and 3B.

It has been discovered that the resolution of charge balance feedback circuits of the general type shown in FIG. 1 are limited by several noise problems. To address these problems, resistors R1 and R2 have been added to charge packet generator circuit 12; and switches S5, S6, and S7 have been added to integrating and comparating circuit 14.

Resistors R1 and R2 address two different noise problems. The first noise problem can best be understood by considering an embodiment of measurement circuit 10 as a two-wire transmitter, as shown in FIG. 4. In this embodiment, integrating/comparating circuit 14 (FIG. 1), feedback circuit 16, output circuit 18, and switches S1-S4 of generator circuit 12 are incorporated into capacitance to digital (C/D circuit 100 shown in FIG. 4. The output of C/D circuit 100 is a digital signal which is supplied to readout circuit 20. In the embodiment shown in FIG. 4, readout circuit 20 includes microcomputer 102 (which performs ranging and correction functions), control 104, current source 106, feedback resistor $R_F$, voltage regulator 108, terminals 110 and 112, capacitors CP1 and CP2, and resistors RP1 and RP2.

Terminals 110 and 112 are connected to a conventional two-wire industrial process control current loop (not shown). The loop current $I_L$ is controlled by measurement circuit 10 as a function of the sensed parameter (in this case, differential pressure sensed by capacitive pressure sensor 22). The digital signal, as corrected by microprocessor 102, is provided to control 104. The operation of current source 106 is controlled by control 104 as a function of the signal from microprocessor 102 and a feedback signal which is representative of the current flowing through feedback resistor $R_F$.

The supply voltages $V_{DD}$ and $V_{SS}$ are derived by voltage regulator 108 from the signal ($I_L$) on the two-wire loop. $V_{DD}$ and $V_{SS}$ are used to power all of the circuitry of measurement circuit 10, including control 104, microprocessor 102, and C/D circuit 100.

Measurement circuit 10 is contained within a transmitter housing 114, which is typically connected to earth-ground. CP1 and RP1 provide a low impedance protection circuit between terminal 112 and transmitter housing 114. Similarly, capacitor CP2 and resistor RP2 form a low impedance protection circuit between $V_{DD}$ and housing 114. Typically, a ground connection is made between terminal 112 and ground. This ground connection may be made at any location, from the transmitter, back at the control room end of the two-wire current loop.

In this particular embodiment, sensor 22 is a capacitive pressure sensor having an electrically conductive, grounded (to housing 114) fluid isolator assembly which is a part of transmitter housing 114, which encloses sensor 22. As a result, stray capacitive coupling, as represented by stray capacitances CS1, CS2, and CS3, is introduced between housing 114 and each of the plates of capacitive pressure sensor 22.

Because circuit 10 shown in FIG. 4 is used as a transmitter in a typical industrial environment, it will be exposed to undesired noise which will appear between earth-ground (and therefore housing 114) and the ground to which terminal 112 is attached. For example, in a typical industrial environment, there can be gradients in earth potential from location to location. In addition, noise currents typically flow through earth-ground loops within an industrial installation. These noise currents can be the result, for example, of the operation of electrical motors and the transients caused by operation of relays. In FIG. 4, the effect of this noise is illustrated by a noise generator $E_N$ connected and shown in phantom between housing 114 and $V_{SS}$. The resulting noise can be coupled through stray capacitances CS1, CS2, and CS3 to capacitor sensor 22 and to C/D circuit 100. This can, in turn, result in currents which affect the accuracy and resolution of measurement circuit 10.

One important function of resistances R1 and R2, therefore, is to suppress noise current which would otherwise affect the accuracy of the output of C/D circuit 100. Resistors R1 and R2 are chosen to be high enough to provide effective current limiting for the noise currents which are induced, yet low enough so that the transfer of charge packets from capacitors C1 and C2 and linearity capacitors CL1 and CL2 can be completed within the time intervals of closure of switches S1-S4.

Resistors R1 and R2 also address the second noise problem. We have found that rather large spikes are produced due to the square wave nature of the $\phi_0$ and $\bar{\phi}_0$ signals used to drive the capacitors. In preferred embodiments, C/D circuit 100 is an integrated circuit which has parasitic diodes between its input or bond pads and the supply voltages $V_{DD}$ and $V_{SS}$. When a spike is supplied to C/D circuit 100 which exceeds $V_{DD}$ or falls below $V_{SS}$, one of the parasitic diodes will conduct charge. In essense, the parasitic diodes act as protection for the remaining circuitry of C/D circuit 100. In this case, however, the conduction of the diode is a result of the transient spike produced when the $\phi_0$ or $\overline{\phi}_0$ signal switches cause charge to flow to or from the inverting (−) input of integrator 30. This flow of charge represents an error which affects the accuracy of the measurement provided by measurement circuit 10.

Resistors R1 and R2 limit the transient spikes produced when the $\phi_0$ and $\overline{\phi}_0$ signals change state. By limiting the spikes to a magnitude which will not cause the parasitic diodes at the inputs of C/D circuit 100 to break down, there will be no charge leakage and, therefore, a source of inaccuracy in the measurement is eliminated. Alternatively, this second noise problem can also be improved by inserting resistors between the $\phi_0$ $\overline{\phi}_0$ lines and C1, C2, CL1, CL2.

A third noise problem is addressed by measurement circuit 10 of FIG. 1 by the use of switches S5, S6, S7 together with a dual level comparator formed by comparator 32 and resistors R3 and R4. The use of resistors R3 and R4 give comparator 32 a hysteresis characteristic so that comparator 32 is less sensitive to small noises at its input. In one preferred embodiment of the present invention, $V_{REF}$ is approximately midway between $V_{DD}$ and $V_{SS}$, and resistors R3 and R4 establish an upper threshold level of $V_{REF}$ plus 100 millivolts and a lower threshold level of $V_{REF}$ minus 100 millivolts. This provides a total of about 200 millivolts hysteresis in the operation of comparator 32.

Switches S5, S6, and S7 allow the inverting (−) input of comparator 32 to be multiplexed. Depending on which switch is closed, comparator 32 can receive the integrator output signal $V_I$, supply voltage $V_{DD}$, or supply voltage $V_{SS}$.

When switch S6 is closed, supply voltage $V_{DD}$ is applied to the minus input of comparator 32. This causes the output of comparator 32 to go LO. By virtue of resistors R3 and R4, this sets the threshold level at the + input of comparator 32 at its low threshold level.

When switch S7 is closed, supply voltage $V_{SS}$ is supplied to the minus input of comparator 32. $V_{SS}$ is below the low threshold level of comparator 32, therefore the output of comparator 32 goes high. This causes the high threshold level to be applied to the + input of comparator 32.

When S5 is closed, the output of integrator 30 is applies to the − input of comparator 32. Because the output of integrator 30 could be any potential, it is possible that the integrator output could place comparator 32 in a low overdrive situation where there are several millivolts or less of potential between the − and + inputs and in that case, comparator 32 has an indeterminate response. In worst case, comparator 32 could actually oscillate with an input which creates a very low overdrive situation. The oscillation depends upon parasitic factors associated with comparator 32. In any case, it is undesirable to have comparator 32 oscillate, because an oscillation at the output of comparator 32 constitutes a noise source which can be fed back through feedback circuit 16 to cause noise at the input of integrator 30.

There is a period in the integration process which is the "critical time". This "critical time" is the instant when switch S1 or S2 is opened, because that is when the measurement charge is effectively sampled onto integrating capacitor $C_I$. Anything that disturbs integrator 30 during the critical time will cause a measurement error. It is desirable, therefore, that the entire measurement circuit 10 be very "quiet" during the critical time. By proper timing of the actuation of switches S5, S6, and S7, it is possible to ensure that comparator 30 is stable during the critical time.

The timing of the various signals produced by feedback circuit 16 is shown in FIGS. 3A and 3B. It can be seen that signals $\phi_0$, $\phi_{VDD}$, and $\phi_{VSS}$ do not overlap in time (see FIG. 3A).

The particular switch S6 or S7 which is used to set the output and the threshold level of comparator 32 prior to switch S5 being closed depends upon whether the integration in integrator 30 is of charge packets delivered through switch S1 or charge packets delivered through switch S2.

In the preferred embodiment which has been illustrated, a negative integration takes place when $\phi_0$ is high, and a positive integration occurs when $\phi_0$ is low. In the case of a positive integration, comparator 32 is set to have a low output, so that comparator 32 is determining whether the integrator output $V_I$ is stablilized above the lower threshold level. In the case of a negative integration, the output of comparator 32 is set high so that $V_I$ is compared with the upper reference level to determine whether $V_I$ has stablized below the upper reference level.

With the use of switches S5, S6, and S7 (together with adjustable hysteresis in comparator 32 through resistors R3 and R4), the present invention ensures more stable and therefore more accurate operation of measurement circuit 10. This addresses the third noise problem which is caused by undesired oscillation of the output of the comparator during the "critical time" of charge transfer to integrator 30.

Although the present invention has been described with reference to preferred embodiments, workers skilled in the art will recognize that changes may be made in form and detail without departing from the spirit and scope of the invention. For example, although the present invention has been described in the context of a particular charge balance feedback type circuit, the improvements provided by the present invention are applicable to a variety of different circuits, including other circuits of this general type described in the two previously mentioned copending patent applications.

What is claimed is:

1. A measurement circuit for providing an output signal as a function of a parameter, the circuit comprising:

generating means for providing a generator signal which is formed by a plurality of charge packets and which is a function of the parameter, the generator means including reactance means for forming the charge packets; switching means for coupling the charge packets; and noise-suppression means connected in series with the reactance means and the switching means;

measurement means coupled to the generating means for receiving the charge packets and measuring the generator signal to provide a measurement signal as a function thereof;

feedback means coupled to the measurement means as a function of the measurement signal to control the generator means such that the generator signal tends toward a charge-balanced state;

output means for providing the output signal as a function of a count of a number of charge packets contained in the generator signal.

2. The measurement circuit of claim 1 wherein the switching means is controlled as a function of a feedback signal for controlling the coupling of the charge packets from the reactance means to the measurement means.

3. The measurement circuit of claim 2 wherein the charge packets formed by the reactance means include a first portion of the charge packets having a first polarity and a second portion of charge packets having a second polarity opposite the first polarity.

4. The measurement circuit of claim 3 wherein the measurement means includes:

integrator means for accumulating the charge packets contained in the generator signal for providing an integrator signal as a function of accumulated charge;

comparator means for comparing the integrator signal to one of two threshold levels and providing the measurement signal as a function of the comparing; and means for selecting the threshold level used by the comparator means.

5. The measurement circuit of claim 4 wherein the measurement means further includes:

means for selectively connecting the integrator signal to the comparator means.

6. The measurement circuit of claim 5 wherein the means for selecting and the means for selectively connecting are controlled by the feedback means.

7. The measurement circuit of claim 6 wherein the feedback signal controls the switching means for changing the polarity of the charge packets.

8. A transmitter for providing a transmitter output as a function of a sensed parameter, the transmitter comprising:

generator means for providing a generator signal, as a function of the sensed parameter, which is formed by a plurality of charge packets; the generator means including reactance means for forming the charge packets;

integrator means for accumulating charge from the charge packets to provide an integrator output which is a function of the generator signal;

comparator means for providing a comparator output indicating whether the integrator output has passed one of first and second comparator thresholds;

first switching means for selectively supplying a first voltage to the comparator means to cause the comparator means to have the first comparator threshold;

second switching means for selectively supply a second voltage to the comparator means to cause the comparator means to have the second comparator thresholds;

feedback means for providing a feedback signal to the generating means as a function of the comparator output to control the generator means such that the charge accumulated by the integrator means tends toward charge balance; and output means coupled to the feedback means for providing the transmitter output as a function of a count of charge packets contained in the generator signal.

9. The transmitter of claim 8 and further comprising:

third switching means connected between the integrator means and the comparator means for selectively supplying the integrator signal to an input for the comparator means.

10. The transmitter of claim 8 wherein the generator means includes switch means controlled as a function of the feedback signal for controlling the coupling of the charge packets from the reactance means to the integrator means.

11. The transmitter of claim 10 and further comprising noise-suppression resistance means connected in a current path with the reactance means and the switch means.

12. The transmitter of claim 11 wherein the noise-suppression resistance means is connected between the reactance means and the switch means.

13. The transmitter of claim 12 wherein the reactance means is a dual plate capacitive pressure sensor.

14. The transmitter of claim 13 wherein the transmitter has a housing and wherein the resistance means has a resistance sufficient to suppress effects of electrical noise coupled to the dual plate capacitive pressure sensor through stray capacitance between the housing and the sensor.

15. A circuit for providing an output signal as a function of a parameter, the circuit comprising:

generator means for providing a generator signal which is formed by a plurality of charge packets and which is a function of a parameter, the generator means including:

reactance means for forming the charge packets;

switching means actuable for coupling the charge packets from the reactance means to a generator output to provide the generator signal; and resistance means connected between the reactance means and the switching means for suppressing noise;

measurement means coupled to the generator means for receiving the charge packets and measuring the generator signal to provide a measurement signal as a function thereof;

feedback means coupled to the measurement means for actuating the switching means as a function of the measurement signal; and output means for providing an output signal representative of a count of a number of charge packets contained in the generator signal.

16. A circuit for providing an output as a function of an input, the circuit comprising:

generator means for providing a generator signal which is formed by a plurality of charge packets and which is a function of the input, the generator means including reactance means for forming the charge packets;

measurement means for providing a measurement signal as a function of the generator signal;

dual-threshold comparator means for providing a comparator output indicating that the measurement signal has passed a selected comparator threshold;

means for selecting the comparator threshold;

feedback means for providing a feedback signal to the generator means as a function of the comparator output to control the generator means such that the generator signal tends to toward a charge-balanced state; and output means for providing an output signal as a function of a count of the number of charge packets.

17. The circuit of claim 16 and further comprising: means for selectively providing the measurement signal to the dual-threshold comparator means.

18. A measurement circuit for providing a measurement output as a function of a process variable, the measurement circuit comprising:

sensing means forming a first number of charge packets having a first polarity and a second polarity opposite the first polarity, each of such packets comprising a quantity of charge, the quantity of charge in at least some of the packets being a function of the process variable;

integrator means for receiving the charge packets and providing an integrator output representative of the quantities of charge received;

control means for controlling the first and second numbers of charge packets as a function of the integrator output and first and second threshold levels such that the quantity of charge received by the integrator means is balanced;

means for selecting one of the first and second threshold levels to be compared with the integrator output by the control means; and output means for providing an output as a function of a ratio of the first and second numbers.

19. The measurement circuit of claim 18 and further comprising:

means for selectively supplying the integrator output to the control means.

20. A measurement circuit for providing a measurement output as a function of a process variable, comprising:

first reactance means for forming a first number of charge packets as a function of the process variable;

second reactance means for forming a second number of charge packets substantially independent of the process variable;

integrator means for receiving the charge packets and providing an integrator output representative of an accumulated quantity of charge received;

first and second resistance means connected between the integrator means and the first and second reactance means, respectively;

control means for controlling the first and second numbers as a function of the integrator output such that the accumulated quantity of charge received by the integrator means tends toward a balance; and output means for providing an output representing the process variable as a function of the first and second numbers.

21. A transmitter for providing an output representative of a sensed parameter, the transmitter comprising:

generator means for providing a generator signal comprising a plurality of charge packets at least some of which have a magnitude of charge which is a function of a sensed parameter; the generator means including reactance means for forming the charge packets in response to electrical excitation;

measurement means coupled to the generating means for receiving the charge packets measuring the generator signal to provide a measurement signal as a function thereof;

feedback means coupled to the measurement means for providing a feedback signal to the generating means as a function of the measurement signal and for providing an output signal representative of the quantity of charge packets; and noise-suppression resistance means connected in a current path which includes the reactance means and the measurement means.

22. The transmitter of claim 21 wherein the noise-suppression resistance means is connected between the reactance means and the measurement means.

23. A circuit for providing an output signal as a function of a sensed parameter, the circuit comprising:

reactance means for forming positive and negative charge packets, at least some of the charge packets having a quantity of charge which varies as a function of the sensed parameter;

means for storing charge from the charge packets;

means for altering polarity of the charge packets being provided to the means for storing when an amount of charge stored passes a threshold, so that quantities of positive and negative charge provided to the means for storing tends toward a balanced state;

resistance means connected in a current path with the reactance means and means for storing charge; and means for providing the output signal based upon a count of charge packets provided to the means for storing.

24. A circuit for providing an output as a function of a sensed parameter, the circuit comprising:

generator means for providing a generator signal which is formed by a plurality of charge packets and which is a function of the sensed parameter, the generating means including reactance means for forming the charge packets;

measurement means for providing a measurement signal as a function of the generator signal;

comparator means responsive to the measurement signal for providing a comparator output indicating that the measurement signal has passed a first comparator threshold in a first direction and providing a second comparator output indicating that the measurement signal has passed a second comparator threshold in a second direction;

means for selectively providing the measurement signal to the comparator means;

feedback means for providing a feedback signal to the generating means as a function of the comparator output to control the generator means such that the generator signal tends toward a charge-balanced state;

output means for providing an output signal as function of a count of charge packets.

25. The circuit of claim 24 and further comprising: means for selectively causing the comparator means to compare the measurement signal to one of the first and second comparator thresholds.

UNITED STATES PATENT AND TRADEMARK OFFICE
CERTIFICATE OF CORRECTION

PATENT NO. : 4,878,012

DATED : October 31, 1989

INVENTOR(S) : John P. Schulte et al.

It is certified that error appears in the above-identified patent and that said Letters Patent is hereby corrected as shown below:

In the Abstract, line 9, delete "integrater" and insert --integrator--.

Column 5, line 54, delete "applies" and insert --applied--.

Column 7, line 58, delete "supply" and insert --supplying--.

Column 9, line 1, after "tends" delete "to".

Signed and Sealed this

Fifteenth Day of January, 1991

*Attest:*

HARRY F. MANBECK, JR.

*Attesting Officer*     Commissioner of Patents and Trademarks